United States Patent [19]

Yamazaki

[11] Patent Number: 5,440,152

[45] Date of Patent: Aug. 8, 1995

[54] HETEROJUNCTION BIPOLAR TRANSISTOR HAVING PARTICULAR GE DISTRIBUTIONS AND GRADIENTS

[75] Inventor: Toru Yamazaki, Tokyo, Japan

[73] Assignee: NEC Corporation, Tokyo, Japan

[21] Appl. No.: 348,216

[22] Filed: Nov. 28, 1994

[30] Foreign Application Priority Data

Nov. 26, 1993 [JP] Japan .................................. 5-296496

[51] Int. Cl.$^6$ ................... H01L 29/73; H01L 27/082; H01L 27/00
[52] U.S. Cl. ................................... 257/197; 257/198; 257/378; 257/616
[58] Field of Search ............... 257/197, 198, 616, 591, 257/592, 593, 596, 19, 20, 378, 101

[56] References Cited

FOREIGN PATENT DOCUMENTS 1-289163 11/1989 Japan .
2-106937 4/1990 Japan .
3-44937 2/1991 Japan .

OTHER PUBLICATIONS

G. L. Patton et al., "SiGe-Base Heterojunction Bipolar Transistors: Physics and Design Issues", IEDM Technical Digest, 1990, pp. 13-16.
E. J. Prinz, et al., "The Effect of Base-Emitter Spacers and Strain-Dependent Densities of States in Si/Si$_{1-x}$-Ge$_x$/Si Heterojunction Bipolar Transistors", IEDM Technical Digest, 1989, pp. 639-642.

Primary Examiner—Robert P. Limanek
Assistant Examiner—Wael M. Fahmy
Attorney, Agent, or Firm—Foley & Lardner

[57] ABSTRACT

A semiconductor device with HBT that enables the cutoff frequency of the HBT to be restrained from lowering at higher collector current levels. The HBT has an emitter region, a SiGe base region, and first and second SiGe collector regions. The first collector region is adjacent to the base region. The base region has a first distribution of Ge concentration graded as a function of depth. The Ge concentration of the first distribution increases at a first gradient as a function of depth from a base-emitter junction to a base-collector junction. The first and second collector regions have second and third distributions of Ge concentration graded as a function of depth. A minimum Ge concentration of the second distribution is not lower than a maximum Ge concentration of the third distribution. In the vicinity of an interface of the first and second collector regions, Ge concentration of the second distribution decreases at a second gradient as a function of depth to the interface, Ge concentration of the third distribution decreases at a third gradient smaller than the second gradient as a function of depth from the interface toward an opposite end of the interface.

16 Claims, 6 Drawing Sheets

HETEROJUNCTION BIPOLAR TRANSISTOR HAVING PARTICULAR GE DISTRIBUTIONS AND GRADIENTS

BACKGROUND OF THE INVENTION

1. Field of the Invention

The present invention relates to a semiconductor device and more particularly, to a semiconductor device with a heterojunction bipolar transistor (HBT) in which the cutoff frequency is restrained from lowering.

2. Description of the Prior Art

Conventionally, silicon (Si) bipolar transistors whose emitter-base junctions are homojunctions have been widely used. In recent years, Si-based heterojunction bipolar transistors (HBTs) have been developed to improve the performance. Examples of such HBTs are disclosed in the Japanese Patent Publication Nos. 2-106937 and 1-289163.

The conventional HBTs have developed for the reason of the dc common-emitter current gain $h_{FE}$. In detail, when a material with an energy-band gap or forbidden-band width narrower than that of silicon is used as a base, which is termed a "narrow-gap base", the gain $h_{FE}$ becomes higher due to its higher emitter injection efficiency than that of the conventional homojunction bipolar transistor.

Also, with the conventional homojunction bipolar transistors, in general, to realize a high speed operation of a bipolar transistor, the base width is narrow and the base doping concentration is high for reducing the base resistance. In the case, there is a disadvantage that the gain $h_{FE}$ decreases due to the high base doping concentration.

On the other hand, with the conventional HBTs, even if the base doping concentration is high, the gain $h_{FE}$ does not decrease because of the energy band structure, i.e., the band gap difference between the emitter and base of the HBTs. As a result, the gain $h_{FE}$ becomes higher than that of the conventional homojunction bipolar transistors in high speed applications.

A mixed crystal or alloy of silicon and germanium (Ge), i.e., SiGe, has been widely researched as a material with a narrower forbidden-band width than that of Si. A conventional semiconductor device containing an HBT with an SiGe narrow-gap base is shown in FIG. 1, which is disclosed in the Japanese Patent Publication No. 3-44937 (February, 1991).

As shown in FIG. 1, a patterned insulator film 102 for isolation is formed on the top face of an n-type Si substrate 101 and a collector electrode 109 made of aluminum (Al) is formed on the bottom face of the substrate 101. A p-type base region 113 of an npn-type HBT is selectively formed in the substrate 101 adjacent to the top face thereof. A Ge-diffusion region 110 is selectively formed inside the substrate 101 adjacent to the base region 113. The portion of the substrate 101 except for the base region 113 acts as a collector of the HBT.

A base electrode 108 made of Al is formed on the insulator film 102 to be contacted with the base region 113 through a contact hole of the film 102.

An emitter region 106 made of n-type Si is selectively formed on the insulator film 102 to be contacted with the base region 113 through another contact hole of the film 102. An emitter electrode 107 made of Al is selectively formed on the emitter region 106.

The p-type SiGe base region 113 and the diffusion region 110 are formed by diffusion of Ge. Specifically, Ge atoms are selectively diffused into the n-type Si substrate 101 from the top face thereof in solid-state or liquid-state. The Ge atoms thus diffused are distributed in the substrate 101 according to the dopant concentration profile shown in FIG. 2. The Ge content gently and monotonically decreases as depth x from the top face of the substrate 101 increases.

The dopant concentration of the p-SiGe base region 113 is also shown in FIG. 2, where the concentration decreases monotonically as depth x increases. The dopant concentration decreases more abruptly than the Ge content.

In the case that a Si-Ge base region is epitaxially grown on a single-crystal Si substrate, the base region different in composition from the substrate is directly grown on the substrate. Therefore, the Ge content abruptly changes at the interface or heterojunction of the base region and the substrate, and as a result, crystal defects readily arises at the interface or heterojunction.

With the conventional semiconductor device shown in FIGS. 1 and 2, however, the Ge content gently changes at the interface of the p-SiGe base region 113 and the n-Si substrate 101. As a result, the crystal defects are effectively restrained.

The conventional HBT with the narrow-gap base shown in FIGS. 1 and 2 has the following problems:

A first problem is the mobility reduction of the minority carrier in the base region 113 due to the backward drifting electric-field, resulting in reduction of the cutoff frequency $f_T$.

In detail, when the Ge content at the base-emitter junction is higher than that at the base-collector junction in the base region 113, as shown in FIG. 2, for example, 15% at the base-emitter junction and 5% at the base-collector junction, the band gap difference between the base-emitter and base-collector junctions is about 75 meV and the backward drifting electric-field is about 15 to 20 kV/cm. Due to this electric-field, the cutoff frequency $f_T$ decreases by 10 GHz.

To avoid the backward drifting electric-field stated above, another conventional HBT shown in FIGS. 3 and 4 was developed, in which the Ge content at the base-emitter junction is lower than that at the base-collector junction in the base region. This device is disclosed in IEDM Technical Digest, 1990, pp13–16, written by G. L. Platton, et al.

FIG. 3 shows the dopant concentration of the HBT of G. L. Platton, et al. along the line perpendicular to the top face of the semiconductor substrate. In FIG. 3, the reference numerals 31, 33, 30, 23 and 22 show an emitter electrode made of n-type polysilicon, an n-type emitter region, a p-type intrinsic base region, an n-type collector region, and an n+-type buried region, respectively.

As shown in FIG. 3, the Ge content linearly increases from 0% at the interface of the emitter electrode 31 and the emitter region 33 to 10% at the interface of the base region 30 and the collector region 23, i.e., the base-collector junction. The Ge content linearly and abruptly decreases from 10% at the base-collector junction to 0% in the collector region 23.

With the conventional HBT shown in FIGS. 3 and 4, there is a disadvantage that the p-type dopant such as boron (B) doped into the p-type base region 30 are diffused again toward the n-type collector region 23 during a heat-treatment process or processes in the fabrication process steps thereof, so that the base-collector junction shifts toward the collector region 23. As a result, the cutoff frequency $f_T$ of the HBT deteriorates abruptly due to increase in width of the base region 30 at higher collector current levels, which is a second problem.

The second problem is caused from the following reason:

As described above, the p-type impurity atoms doped into the base region 30 are diffused and redistributed thermally in the vicinity of the base-collector heterojunction, so that the dopant concentration profile thereof shown by the solid line A in FIG. 3 changes to that shown by the broken line B. As a result, the base-collector junction shifts toward the collector region 23.

Therefore, an additional base region whose width is $\Delta W$ is produced by the thermal diffusion of the impurity atoms, so that a resultant width $W_1$ of the base region 30 thus expanded is equal to the sum of the initial width $W_0$ of the original base region 30 grown by molecular beam epitaxy (MBE) and the width $\Delta W$ of the additional base region, i.e., $W_1 = W_0 + \Delta W$.

FIG. 4 shows an energy-band diagram of the HBT shown in FIG. 3, where $E_c$ and $E_V$ represent energies at the bottom of the conduction band and at the top of the valence band, respectively, and $E_F$ represents the Fermi energy.

Due to the shift of the base-collector junction, a parasitic energy barriers EB are generated in the conduction and valence bands in the vicinity of the base-collector junction, as shown in FIG. 4. The energy-band gap in the resultant base region 30 expanded is not such a narrow gap as SiGe and is similar to that of Si.

The parasitic energy barriers EB reduce the number of the carriers injected from the base region 30 into the collector region 23, so that the collector current decreases. Also, the transit time of the carriers travelling across the base regions 30 increases as the height of the barriers EB increases. As a result, the cutoff frequency $f_T$ showing the high-frequency characteristic of the HBT lowers at higher collector current levels.

The relationship between such the parasitic energy barriers and the impurity redistribution in the base region is disclosed in IEDM Technical Digest, 1989, pp 639–642, written by E. J. Prinz, et al.

The parasitic energy barriers EB are caused not only by the metallurgical shift (described above) of the base-collector junction due to diffusion of the impurity atoms doped into the base region but also by the change of the effective base width generated at higher collector current levels, which is termed the "base push-out".

SUMMARY OF THE INVENTION

Accordingly, an object of the present invention is to provide a semiconductor device with an HBT in which the cutoff frequency of the HBT can be restrained from lowering at higher collector current levels.

Another object of the present invention is to provide a semiconductor device with an HBT in which a higher load driving capability can be obtained than that of the conventional ones.

A semiconductor device according to the present invention contains an HBT that has an emitter region of a first conductivity type, a base region of a second conductivity type, and first and second collector regions of the first conductivity type. The first collector region is adjacent to the base region. The emitter region is made of single-crystal Si and may contain Ge. The base region and the first and second collector regions are made of Ge-containing single-crystal Si.

The base region has a first distribution of Ge concentration that is graded as a function of depth of the base region. The Ge concentration of the first distribution increases at a first gradient as a function of depth of the base region from a base-emitter junction to a base-collector junction.

The first collector region has a second distribution of Ge concentration graded as a function of depth of the first collector region. The second collector region has a third distribution of Ge concentration graded as a function of depth of the second collector region.

A minimum value of Ge concentration of the second distribution is higher than or equal to a maximum value of Ge concentration of the third distribution.

In the vicinity of an interface of the first and second collector regions, Ge concentration of the second distribution in the first collector region decreases at a second gradient as a function of depth of the first collector region to the interface, Ge concentration of the third distribution in the second collector region decreases at a third gradient as a function of depth of the second collector region from the interface toward an opposite end of the interface. The third gradient is smaller than the second gradient.

The peak or maximum value of Ge concentration may be placed at an interface of the base region and the first collector region or inside the first collector region. In the latter case, preferably, Ge concentration increases at a base-side of the peak and decreases at a second collector-side of the peak as a function of depth of the first collector region.

The peak of Ge concentration is preferably 20 mole % or less, because crystal defects readily arise in the base region if the peak is larger than 20 mole %.

The depth of the first collector region preferably ranges from 20 nm to 60 nm. If the depth is smaller than 20 nm, crystal defects readily arise in the first collector region. Also, if the depth is larger than 60 nm, the carriers are affected largely by the backward drifting electric-field in the first collector region.

Preferably, the first, second and third gradients are substantially constant. However, they may change as a function of depth thereof.

Further, preferably, the base region is p-type, and the emitter region and the first and second collector regions are n-type, because the minority carrier is an electron that is larger in mobility than a hole.

The semiconductor device of the invention may contain an MOS field-effect transistor whose source/drain regions have a fourth distribution of Ge concentration graded as a function of depth of the source/drain regions. The fourth distribution is the same as the third distribution of the second collector region.

With the semiconductor device according to the present invention, the base region has the first distribution of Ge concentration that is graded as a function of depth of the base region, and the Ge concentration of the first distribution increases at the first gradient as a function of depth of the base region from the base-emitter junction to the base-collector junction. Therefore, no backward drifting electric-field is produce in the base region, and a forward drifting electric-field is obtained therein.

In addition, the first and second collector regions have the second and third distributions of Ge concentration, and the minimum value of Ge concentration of the second distribution is higher than or equal to the maximum value of Ge concentration of the third distribution. Further, in the vicinity of the interface of the first and second collector regions, the Ge concentration of the second distribution decreases at the second gradient and that of the third distribution decreases at the third gradient smaller than the second gradient as a function of depth of the first and second collector regions.

As a result, no parasitic energy barrier is generated in the conduction and valence bands in the vicinity of the base-collector junction due to shift of the base-collector junction, which means that the cutoff frequency of the HBT can be restrained from lowering at higher collector current levels.

Further in addition, since no parasitic energy barrier is generated in the vicinity of the base-collector junction, a higher load driving ability can be obtained than those of the conventional ones when the HBT drives a load.

DETAILED DESCRIPTION OF THE PREFERRED EMBODIMENTS

Figure 1:
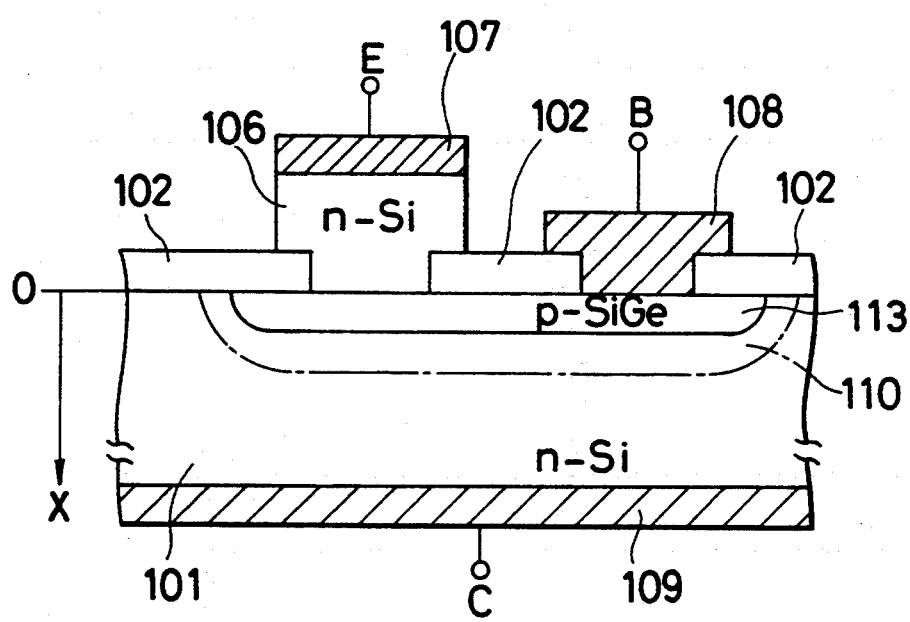
FIG. 1 is a partial cross-sectional view of a conventional semiconductor device.
Figure 2:
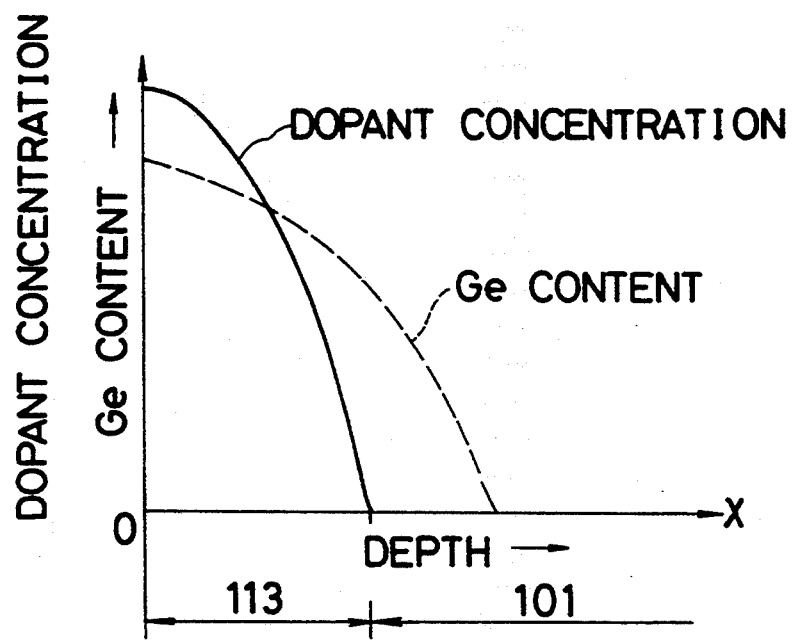
FIG. 2 shows distributions of Ge dopant concentration and Ge content as a function of depth of the conventional semiconductor device shown in FIG. 1.
Figure 3:
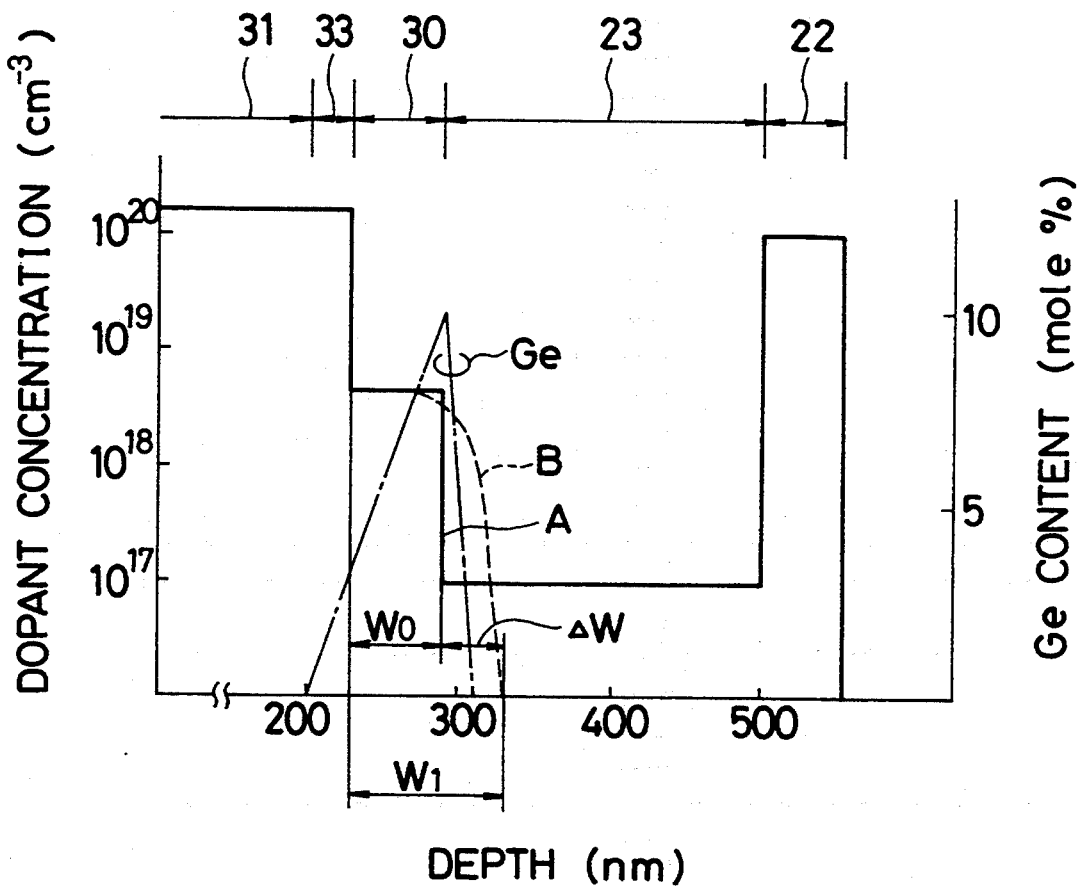
FIG. 3 shows profiles of dopant concentration and Ge content as a function of depth of another conventional semiconductor device.
Figure 4:
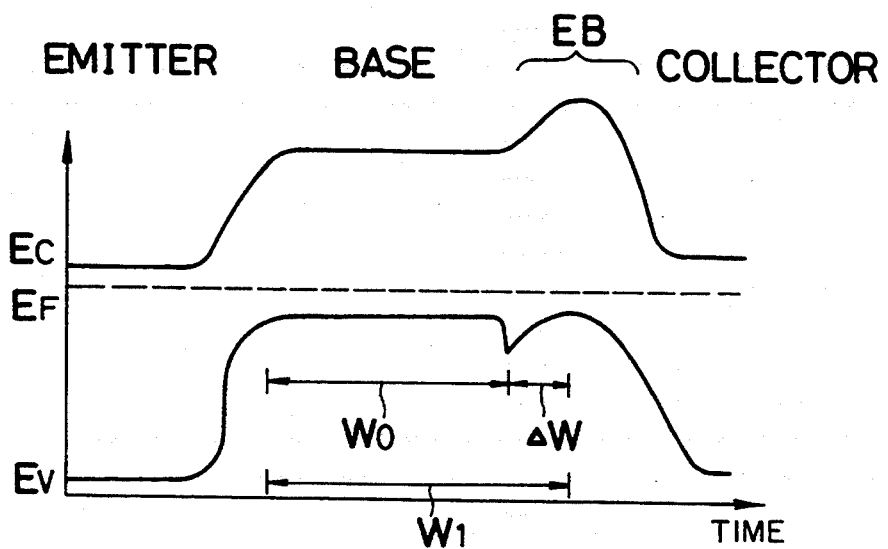
FIG. 4 is an energy-band diagram of the conventional semiconductor device shown in FIG. 3.

Preferred embodiments of the present invention will be described below referring to the drawings attached.

[First Embodiment]

Figure 5:
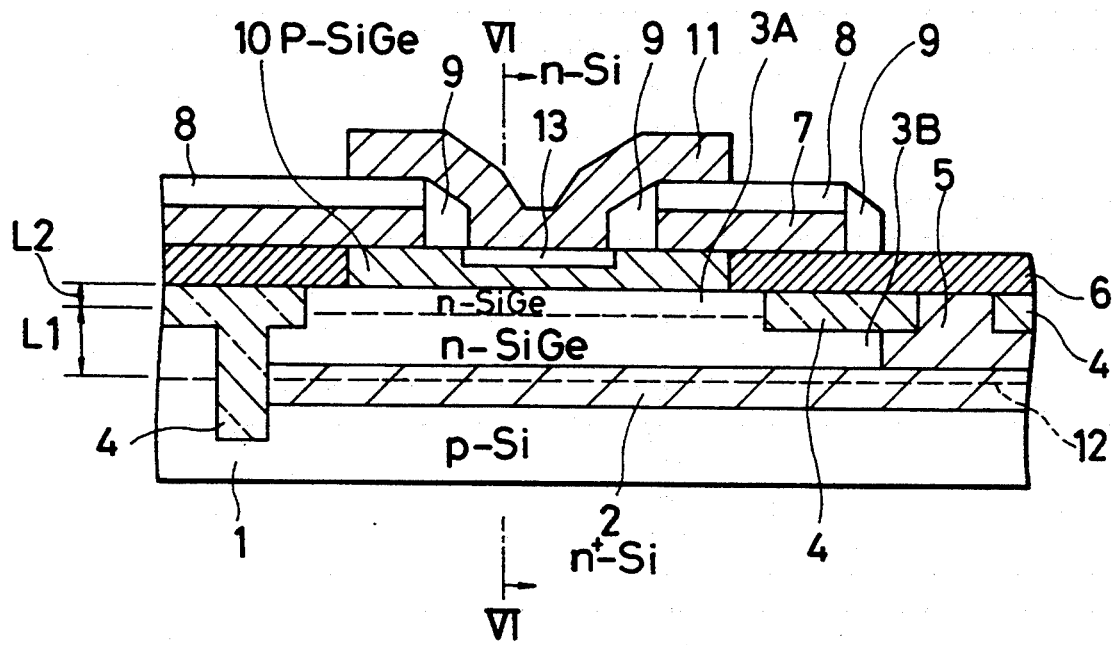
FIG. 5 is a partial cross-sectional view of a semiconductor device according to a first embodiment of the invention.

As shown in FIG. 5, a semiconductor device according to a first embodiment has an npn-type HBT. On a p-type single-crystal Si substrate 1, a first epitaxial layer L1 of n-type Si containing Ge is formed the interface of which is shown by the reference numeral 12. An $n^+$-type buried region 2 is selectively formed in the first epitaxial layer L1 and the substrate 1 in the vicinity of the interface 12.

In the first epitaxial layer L1, a second collector region 3B of the HBT is selectively formed on the buried region 2. The top face of the second collector region 3B is in accordance with the surface of the first epitaxial layer L1.

A second epitaxial layer L2 of n-type Si containing Ge is formed on the first epitaxial layer L1. In the second epitaxial layer L2, a first collector region 3A of the HBT is selectively formed on the second collector region 3B. The top face of the first collector region 3A is in accordance with the surface of the second epitaxial layer L2.

An n-type Si diffusion region 5 as a collector contact is selectively formed in the first and second epitaxial layers L1 and L2 to be contacted with the second collector region 3B and the buried region 2. The top face of the diffusion region 5 is in accordance with the surface of the second epitaxial layer L2.

An isolation oxide film 4 is selectively formed in the substrate 1 and the first and second epitaxial layers L1 and L2. The top face of the film 4 is in accordance with the surface of the second epitaxial layer L2. The first and second collector regions 3A and 3B and the diffusion region 5 are laterally isolated from other devices by the isolation oxide film 4 and are vertically isolated from the substrate 1 by an $n^+$-p junction at an interface of the buried region 2 and the second collector region 3B. The first collector region 3A is laterally isolated from the collector contact 5 by the isolation oxide film 4.

A silicon dioxide ($SiO_2$) film 6 is selectively formed on the surface of the second epitaxial layer L2. The film 6 has a window over the first collector region 3A.

A base region 10 of p-type Si containing Ge is selectively formed on the surface of the second epitaxial layer L2 inside the window of the $SiO_2$ film 6. The base region 10 is formed by a selectively epitaxial growth method.

An n-type diffusion region 13 is selectively formed in the epitaxial layer for the base region 10 to form an emitter region of the HBT. The remainder of the epitaxial layer act as the p-type base region 10 of the HBT.

A p-type polysilicon film 7 is selectively formed on the $SiO_2$ film 6 to be in contact with the outer area of the base region 10. The polysilicon film 7 acts as a base contact.

A silicon nitride ($Si_3N_4$) film 8 is selectively formed on the polysilicon base contact 7. Another $Si_3N_4$ film 9 is selectively formed on the base region 10 and the $SiO_2$ film 6 to be in contact with the side faces of the base contact 7 and the $Si_3N_4$ film 8. The film 9 surrounds the emitter region 13 on the second epitaxial layer L2.

An n-type polysilicon film 11 is selectively formed on the $Si_3O_4$ films 8 and 9 to be in contact with the emitter region 13. The polysilicon film 11 acts as an emitter electrode.

Figure 6:
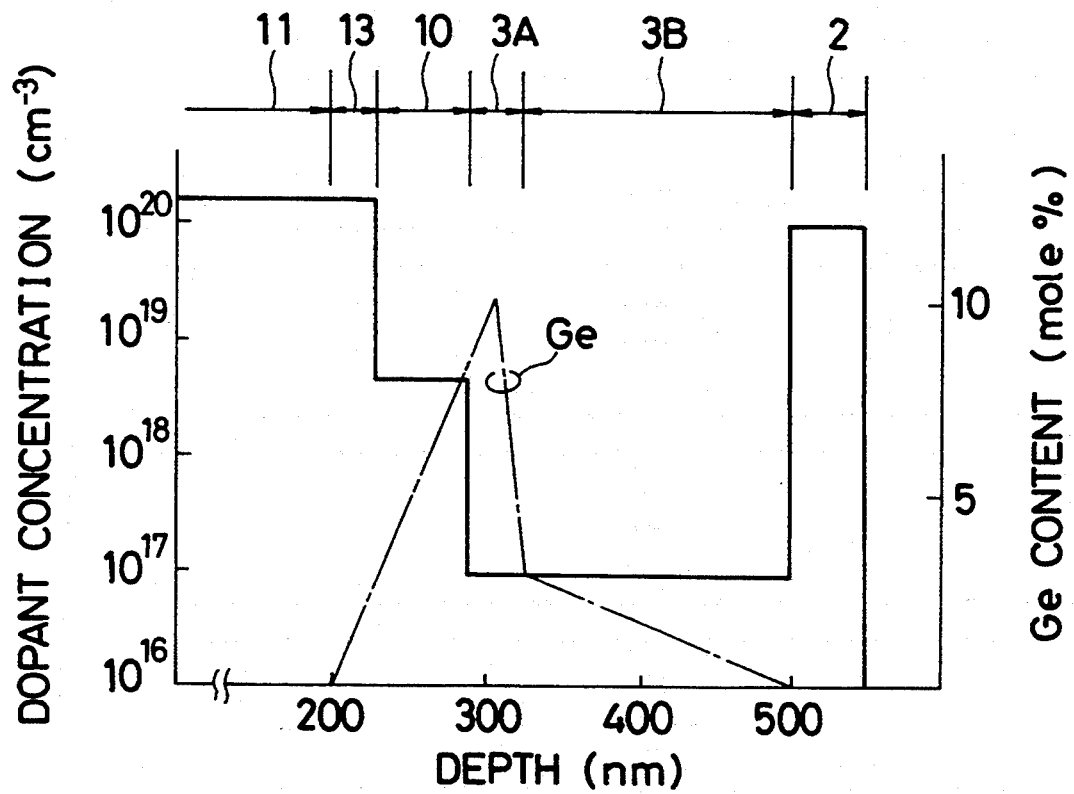
FIG. 6 shows profiles of dopant concentration and Ge content as a function of depth of the semiconductor device according to the first embodiment.

The semiconductor device of the first embodiment described above has the distributions of dopant or impurity concentration and Ge content as shown in FIG. 6 in the cross section along the line VI—VI of FIG. 5.

As shown in FIG. 6, the n-type polysilicon emitter electrode 11 is 200 nm in thickness or depth and $1.2 \times 10^{20}$ cm$^{-3}$ in dopant concentration of an n-type impurity such as phosphorus (P) and arsenic (As). The thickness may be 200 to 300 nm and the dopant concentration may be $1 \times 10^{20}$ to $1 \times 10^{21}$ cm$^{-3}$.

The n-type emitter region 13 is 30 nm in thickness or depth. The dopant concentration is the same as that of the emitter electrode 11. The thickness may be 30 to 40 nm.

The p-type base region 10 is 60 nm in thickness or depth and $4 \times 10^{18}$ cm$^{-3}$ in dopant concentration of a p-type impurity such as boron (B). The thickness may be 30 to 80 nm and the dopant concentration may be $2 \times 10^{18}$ to $1 \times 10^{19}$ cm$^{-3}$.

The n-type first collector region 3A is 20 nm in thickness or depth and $1 \times 10^{17}$ cm$^{-3}$ in dopant concentration of an n-type impurity such as P and As. The thickness may be 20 to 60 nm and the dopant concentration may be $1 \times 10^{16}$ to $6 \times 10^{17}$ cm$^{-3}$.

The n-type second collector region 3B is 170 nm in thickness or depth and $1 \times 10^{17}$ cm$^{-3}$ in dopant concentration of an n-type impurity such as P and As. The thickness may be 50 to 800 nm and the dopant concentration may be $1 \times 10^{16}$ to $6 \times 10^{17}$ cm$^{-3}$.

The n$^+$-type buried region 2 is 50 nm in thickness or depth and $1 \times 10^{20}$ cm$^{-3}$ in dopant concentration of an n-type impurity such as P and As. The dopant concentration may be $5 \times 10^{19}$ to $1 \times 10^{21}$ cm$^{-3}$ and the thickness may be larger than 50 nm.

Next, the Ge contents in the respective regions are described below.

As shown in FIG. 6, the Ge content or mole fraction has graded profiles in the respective regions. In detail, the Ge content increases linearly from the surface of the emitter area 13, i.e., the interface of the emitter electrode 11 and the emitter area 13 to the first collector region 3A. The Ge content is 0 mole % at the interface of the emitter electrode 11 and the emitter area 13. The peak of the Ge content is not placed at the interface of the base region 13 and the first collector region 3A, i.e., at the base-collector junction, and is placed inside the first collector region 3A. The peak is at a position the depth of which is about 110 nm from the interface of the emitter electrode 11 and the emitter region 13. The peak value of the Ge content is 10 mole %.

The Ge content is about mole 2.5% at the emitter-base junction placed at a position the depth of which is about 30 nm from the interface of the emitter electrode 11 and the emitter region 13. The Ge content is about 8 mole % at the base-collector junction placed at a position the depth of which is about 90 nm from the interface.

Therefore, in the base region 10, the Ge content linearly increases from about 2.5 mole % to about 8 mole % as a function of depth of the base region 10.

In a base-side part of the first collector region 3A, the Ge content linearly increases from about 8 mole % to 10 mole % at the same gradient or slope as that of the emitter region 13. In a buried region-side part of the first collector region 3A, the Ge content linearly decreases from 10 mole % at the peak of the content to 3 mole % at the interface of the first and second collector regions 3A and 3B. The interface of the regions 3A and 3B is placed at a position the depth of which is about 130 nm from the interface of the emitter electrode 11 and the emitter region 13.

Thus, the Ge content gently increases in the base-side part of the first collector region 3A and then, abruptly decreases in the buried region-side part thereof, as a function of depth of the first collector region 3A.

The increasing profile of the Ge concentration has a first gradient of about $+10/110$ (mole %/nm) and the decreasing profile thereof has a second gradient of about $-7/20$ (mole %/nm).

Then, the Ge content linearly decreases from 3 mole % at the interface of the first and second collector regions 3A and 3B to 0 mole % at the interface of the second collector region 3B and the buried region 2. The interface of the regions 3B and 2 is placed at a position the depth of which is 300 nm from the interface of the emitter electrode 11 and the emitter region 13.

The decreasing profile of Ge content in the second collector region 3B has a third gradient of about $-3/170$ (mole %/nm). The third gradient is smaller than the second gradient.

Thus, in the second collector region 3B, the Ge content linearly decreases from 3 mole % to 0, which means that it decreases more gently than that of the first collector region 3A.

Ge atoms are not doped into the emitter electrode 11 and the buried region 2.

In the base region 10, the peak of the Ge content or mole fraction is preferably 20% or less. If it is over 20 mole %, the slope or gradient of the Ge dopant concentration line may increase more, so that electrons as the minority carrier can be accelerated due to the increased drifting electric-field still more. However, crystal defects are readily created in the base region 10 because of lattice constant difference between Si and Ge. Accordingly, the Ge content should be 20 mole % or less.

The diffusion process used in the conventional HBT of FIG. 1 cannot realize such the Ge distribution as shown in FIG. 6. The reason is that the Ge concentration at the surface of the second epitaxial layer L2 becomes higher than that of its inside in the case that the Ge atoms are diffused from the surface to the inside of the second epitaxial layer L2. In the first embodiment, since a selectively epitaxial growth method is used, such the Ge distribution as shown in FIG. 6 can be produced easily.

With the semiconductor device of the first embodiment, the base region 10 has the first distribution of Ge concentration that is graded as a function of depth x of the base region 10, and the Ge concentration of the first distribution increases at the first gradient as a function of depth x of the base region 10 from the base-emitter junction to the base-collector junction. Therefore, no backward drifting electric-field is produce in the base region 10, and a forward drifting electric-field is obtained therein.

In addition, the first and second collector regions 3A and 3B have the second and third distributions of Ge concentration, and the minimum value of Ge concentration of the second distribution is equal to the maximum value of Ge concentration of the third distribution. Further, in the vicinity of the interface of the first and second collector regions 3A and 3B, the Ge concentration of the second distribution decreases at the second gradient and that of the third distribution decreases at the third gradient smaller than the second gradient as a function of depth x of the first and second collector regions 3A and 3B.

As a result, no parasitic energy barrier is generated in the conduction and valence bands in the vicinity of the base-collector junction due to shift of the base-collector junction as shown in the conventional one, which means that the cutoff frequency $f_T$ can be restrained from lowering at higher collector current levels.

Figure 7:
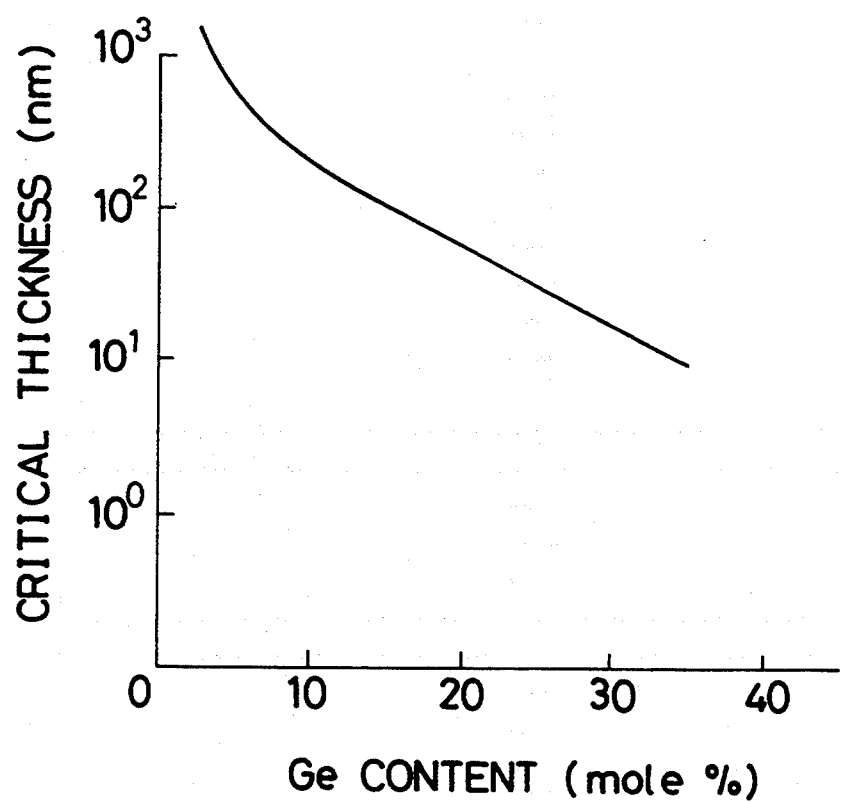
FIG. 7 shows the relationship between the critical thickness of SiGe layer and its Ge content.

FIG. 7 shows the relationship between the critical thickness of SiGe film and its Ge content of the semiconductor device according to the first embodiment. The critical thickness means the maximum thickness of the SiGe film where no crystal defects arise therein.

It is seen from FIG. 7 that the critical thickness abruptly increase at the Ge content of 5 mole % or less.

The first and second collector regions 3A and 3B with the above-described distributions of Ge concentration can be easily grown epitaxially by using a low-pressure chemical vapor deposition (LPCVD) technique with an ultra-high vacuum exhausting system.

Figure 10:
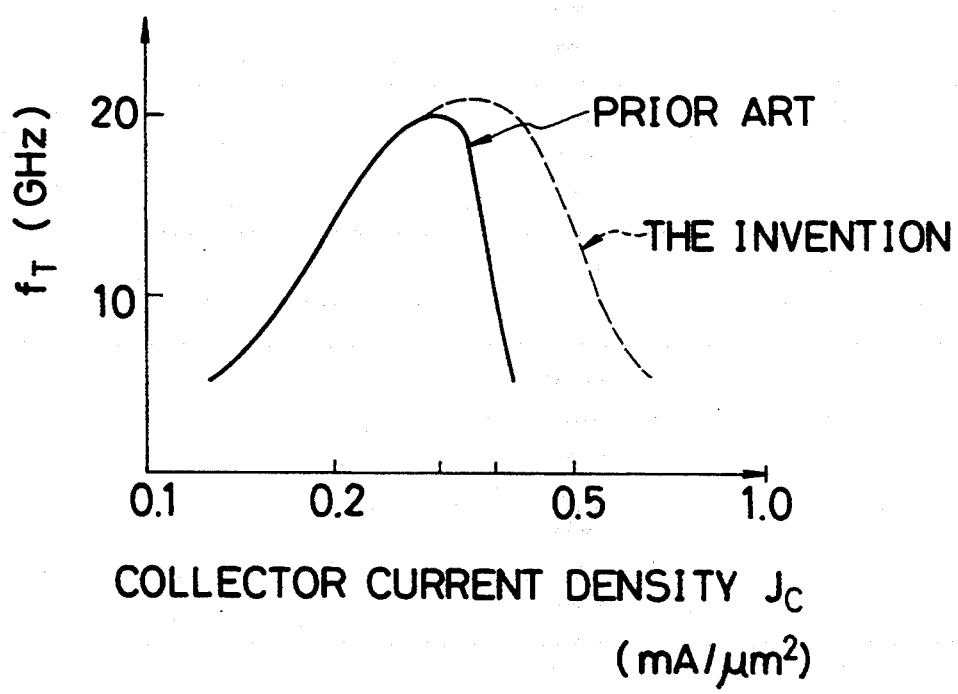
FIG. 10 shows the relationship between the cutoff frequency $f_T$ and the collector current density $J_C$ of the semiconductor device according to the first embodiment.

FIG. 10 shows the relationships between the cutoff frequency $f_T$ and the collector current density $J_o$ of the semiconductor devices of the first embodiment and the conventional one. It is seen from FIG. 10 that the cutoff frequency $f_T$ is restrained from lowering at higher collector current levels.

[Second Embodiment]

Figure 8:
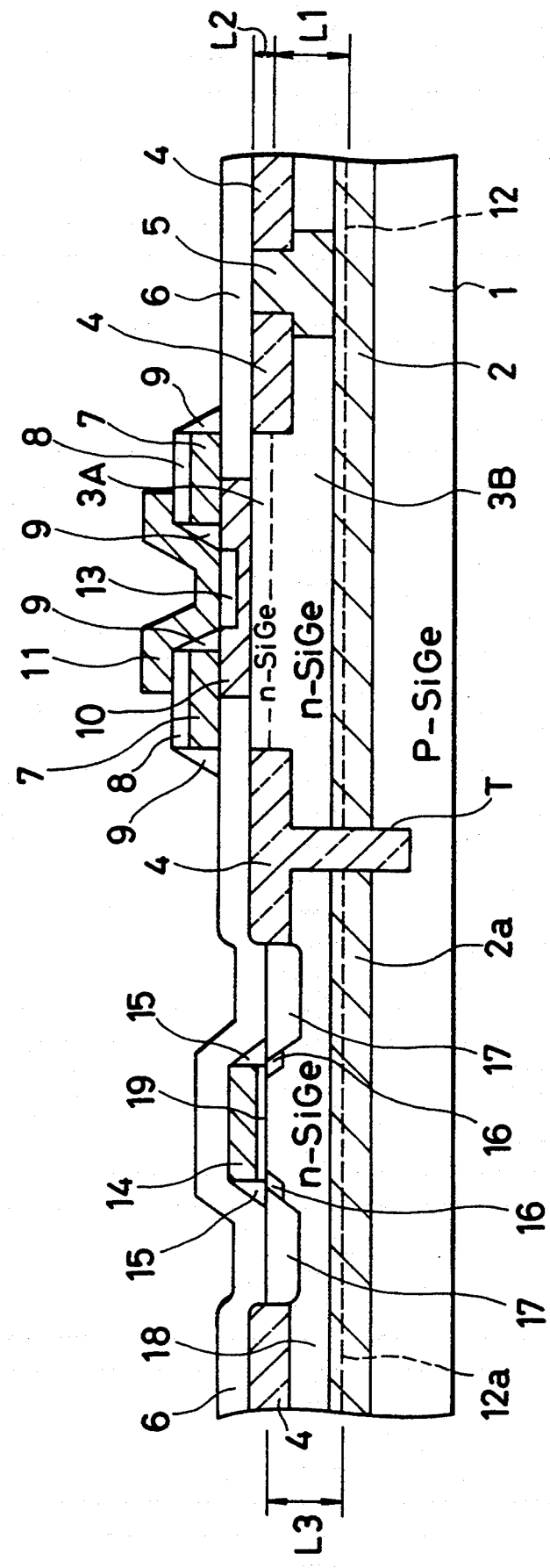
FIG. 8 is a partial cross-sectional view of a semiconductor device according to a second embodiment of the invention.

FIG. 8 shows a semiconductor device according to a second embodiment having an npn-type HBT in a HBT area and a p-channel metal-oxide-semiconductor (MOS) field-effect transistor in an MOS transistor area.

The HBT of the second embodiment is the same in configuration as that of the first embodiment, so that the description thereof is omitted here for the sake of simplification of description.

In the MOS transistor area, a third epitaxial layer L3 of n-type Si containing Ge is formed on the p-type single-crystal Si substrate 1. The interface of the layer L3 and the substrate 1 is shown by the reference numeral 12a. An $n^+$-type buried region 2a is selectively formed in the third epitaxial layer L3 and the substrate 1 in the vicinity of the interface 12a.

The top face or surface of the third epitaxial layer L3 is in accordance with the surface of the first epitaxial layer L1 in the HBT area. Therefore, the thickness of the third epitaxial layer L3 is equal to the thickness of the first epitaxial layer L1.

The third epitaxial layer L3 is preferably formed in the same process step of forming the first epitaxial layer L1. However, the layer L3 may be formed in a different process step from the layer L1.

The third epitaxial layer L3 has the same distribution of Ge content as that of the first epitaxial layer L1, i.e., the second collector region 3B of the HBT. Since the Ge content is 3 mole % or less in the layer L3, the Ge atoms contained do not affect largely to the threshold voltage of the MOS transistor.

The third epitaxial layer L3 is laterally isolated from other devices by the isolation oxide film 4 and is vertically isolated from the substrate 1 by an $n^+$-p junction at an interface of the buried region 2a and substrate 1. The third epitaxial layer L3 thus isolated acts as an n-type well 18.

At the interface of the HBT area and the MOS transistor area, the $SiO_2$ film 4 is buried into a trench T formed in the substrate 1 and the first and third epitaxial layers L1 and L3. If the $SiO_2$ film 4 is formed by thermal oxidation, the Ge atoms are piled up on the interface of the film 4 and the SiGe region. Therefore, this trench isolation is formed to prevent the pile-up phenomenon of the Ge atoms.

In the n-type well 18, a pair of p-type source/drain regions 17 is formed at each side of a channel region. A pair of p-type source/drain regions 16 whose dopant concentrations are lower than the pair of source/drain regions 17 is formed at each side of the channel region adjacent to the pair of source/drain regions 17.

A gate oxide film 19 is formed on the channel region, and a gate electrode 14 is formed on the gate oxide film 19. The gate electrode 14 has a side wall oxide 15 at each side thereof.

The $SiO_2$ film 6 covers the uncovered pair of source/drain regions 17, the gate electrode 14 and the side wall oxide 15.

The process of forming the gate oxide film 19 should be performed by thermal oxidation with a low temperature and a high pressure to prevent Ge from being deposited or precipitated at the interface of the SiGe well 18 and the growing gate oxide film 19. For example, this process is carried out in the oxygen atmosphere at 600 to 700 atom and at 550° C. The thickness of the film 19 is preferably 6 to 10 nm.

Preferably, the other heat-treatment processes of the fabrication process sequence of the second embodiment are carried out at 950° C. or lower to maintain the strain generated in the SiGe films.

Figure 9:
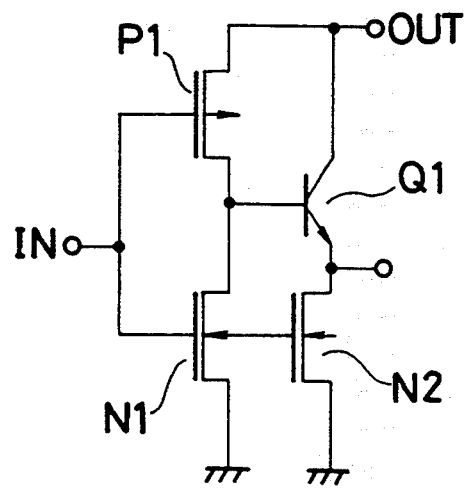
FIG. 9 is a circuit diagram of a BiCMOS inverter in which the semiconductor device according to the second embodiment is applied.

FIG. 9 is a circuit diagram of a BiCOMS inverter in which the semiconductor device according to the second embodiment is applied. The HBT and MOS transistor shown in FIG. 8 correspond to a p-channel MOS transistor P1 and a npn-type bipolar transistor Q1 shown in FIG. 9, respectively. The reference characters N1 and N2 indicate n-channel MOS transistors, respectively.

In the BiCMOS inverter in FIG. 9, in general, the transistor Q1 is driven at a high collector current level to charge and discharge a load capacity (not shown) connected to an output end OUT. In the case of the conventional HBT, the performance of the inverter seriously deteriorates due to the parasitic energy barriers. As a result, the load driving capability of the inverter becomes lower than the case of the conventional Si homojunction bipolar transistor.

On the other hand, when the second embodiment is employed for the bipolar and MOS transistors Q1 and P1, because the parasitic energy barriers are prevented effectively, the load driving capability of the BiCMOS inverter is largely improved.

In the first and second embodiments, the Ge content linearly increases in the base region 10; however, the profile of the base region 10 does not need linear. It is sufficient for the invention that the Ge content increases from the base-emitter junction to the base-collector junction.

Also, although the Ge content linearly and abruptly decreases in the first collector region 3A and it linearly and gently decrease in the second collector region 3B, the Ge content profiles of the first and second collector regions 3A and 3B do not need linear. It is satisfactory for the invention that the second gradient of the first collector region 3A is larger than the third gradient of the second collector region 3B.

The peak of the Ge concentration is preferably 10 to 20 mole % and the value of the Ge concentration at the interface of the first and second collector regions 3A and 3B is preferably 3 to 5 mole %. In the case of this range, no crystal defects arise in the base region 10 and the carriers are hardly affected by the backward drifting electric-field.

The value of the Ge concentration at the interface of the second collector region 3B and the buried region 2 is preferably 5 mole % or less, containing 0 mole %. In the case of this range, a sufficient critical thickness of the second collector region 3B can be obtained such as 1000 nm.

The depth of the first collector region 3A is preferably in the range from 10 nm to 100 nm and is more preferably in the range from 20 nm to 60 nm. If the depth is larger than 100 nm, crystal defects readily arise in the first collector region 3A under the condition of high Ge concentration such as 10 to 15 mole %. Also, if the depth is smaller than 10 nm, parasitic energy barriers called "notches" or "spikes" readily arise at the base-collector junction under the condition of large Ge concentration change such as that from a higher concentration of 10 to 15 mole % to a lower concentration of 5 mole % or less.

In the first and second embodiments, the first, second and third gradients are constant; however, they may change as a function of depth thereof.

Further, although the HBT has the first and second collector regions 3A and 3B, one or more collector regions may be added. That is, in the case of three collector regions, the Ge concentration profile of the above first collector region 3A is not changed, and the Ge concentration profile of the above second collector region 3B is changed to have two different profiles whose gradients are different from each other.

In the case of four or more collector regions, the profiles of the respective collector regions are decided in the similar way as the case of the three collector regions.

The collector regions except for the first collector region 3A, i.e., such as second, third, and fourth ones, may have any types of Ge concentration profiles. It may change not only in inverse proportion to the depth x but also according to the functions $1/x$, $e^{-1}$, or the like.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A semiconductor device comprising:
   an emitter region of a first conductivity type, said emitter region being made of single-crystal Si;
   a base region of a second conductivity type opposite in polarity to said first conductivity type, said base region being made of Ge-containing single-crystal Si;
   a first collector region of said first conductivity type, said first collector region being made of Ge-containing single-crystal Si and being adjacent to said base region;
   a second collector region of said first conductivity type, said second collector region being made of Ge-containing single-crystal Si;
   said emitter region, said base region and said first and second collector regions forming a heterojunction bipolar transistor;
   said base region having a first distribution of Ge concentration that is graded as a function of depth of said base region, Ge concentration of said first distribution increasing at a first gradient as a function of depth of said base region from a base-emitter junction to a base-collector junction;
   said first collector region having a second distribution of Ge concentration graded as a function of depth of said first collector region;
   said second collector region having a third distribution of Ge concentration graded as a function of depth of said second collector region;
   a minimum value of Ge concentration of said second distribution being higher than or equal to a maximum value of Ge concentration of said third distribution; and
   in said vicinity of an interface of said first and second collector regions, Ge concentration of said second distribution in said first collector region decreasing at a second gradient as a function of depth of said first collector region to said interface, Ge concentration of said third distribution in said second collector region decreasing at a third gradient as a function of depth of said second collector region from said interface toward an opposite end of said interface, and said third gradient being smaller than said second gradient.

2. The device as claimed in claim 1, wherein a peak of Ge concentration is 20 mole % or less.

3. The device as claimed in claim 1, wherein a peak of Ge concentration is inside said first collector region, and Ge concentration increases at a base-side of said peak and decreases at a second collector-side of said peak as a function of depth of said first collector region.

4. The device as claimed in claim 3, wherein said peak of Ge concentration is 20 mole % or less.

5. The device as claimed in claim 1, wherein depth of said first collector region ranges from 20 nm to 60 nm.

6. The device as claimed in claim 1, wherein said first, second and third gradients are substantially constant.

7. The device as claimed in claim 1, wherein said base region is p-type, and said emitter region and said first and second collector regions are n-type.

8. The device as claimed in claim 1, further comprising an MOS field-effect transistor whose source/drain regions have a fourth distribution of Ge concentration graded as a function of depth of said source/drain regions, said fourth distribution being the same as said third distribution of said second collector region.

9. A semiconductor device comprising:
   a semiconductor substrate of a first conductivity type;
   a first semiconductor epitaxial layer of a second conductivity type opposite in polarity to said first conductivity type, said first epitaxial layer being formed on said substrate;
   a buried region of said second conductivity type, said buried region being formed in said first epitaxial layer and said substrate in the vicinity of an interface of said first epitaxial layer and said substrate;
   a second semiconductor epitaxial layer of said first conductivity type, said second epitaxial layer being formed on said first epitaxial layer;
   a base region of said second conductivity type, said base region being formed on said second epitaxial layer and being made of Ge containing single-crystal Si;
   an emitter region of said first conductivity type, said emitter region being formed to be in contact with said base region and being made of single-crystal Si;
   a first collector region of said second conductivity type, said first collector region being formed in said first epitaxial layer and being made of Ge-containing single-crystal Si;
   a second collector region of said second conductivity type, said second collector region being formed in said second epitaxial layer to be in contact with said base region and being made of Ge-containing single-crystal Si;
   said emitter region, said base region and said first and second collector regions forming a heterojunction bipolar transistor;

said base region having a first distribution of Ge concentration that is graded as a function of depth of said base region, Ge concentration of said first distribution increasing at a first gradient as a function of depth of said base region from a base-emitter junction to a base-collector junction;

said first collector region having a second distribution of Ge concentration graded as a function of depth of said first collector region;

said second collector region having a third distribution of Ge concentration graded as a function of depth of said second collector region;

a minimum value of Ge concentration of said second distribution being higher than or equal to a maximum value of Ge concentration of said third distribution; and in said vicinity of an interface of said first and second collector regions, Ge concentration of said second distribution in said first collector region decreasing at a second gradient as a function of depth of said first collector region to said interface, Ge concentration of said third distribution in said second collector region decreasing at a third gradient as a function of depth of said second collector region from said interface toward an opposite end of said interface, and said third gradient being smaller than said second gradient.

10. The device as claimed in claim 9, wherein a peak of Ge concentration is 20 mole % or less.

11. The device as claimed in claim 9, wherein a peak of Ge concentration is inside said first collector region, and Ge concentration increases at a base-side of said peak and decreases at a second collector-side of said peak as a function of depth of said first collector region.

12. The device as claimed in claim 11, wherein said peak of Ge concentration is 20 mole % or less.

13. The device as claimed in claim 9, wherein said depth of said first collector region ranges from 20 nm to 60 nm.

14. The device as claimed in claim 9, wherein said first, second and third gradients are substantially constant.

15. The device as claimed in claim 9, wherein said base region is p-type, and said emitter region and said first and second collector regions are n-type.

16. The device as claimed in claim 9, further comprising an MOS field-effect transistor whose source/drain regions have a fourth distribution of Ge concentration graded as a function of depth of said source/drain regions, said fourth distribution being the same as said third distribution of said second collector region.

* * * * *